United States Patent
Shi et al.

(10) Patent No.: US 6,361,886 B2
(45) Date of Patent: *Mar. 26, 2002

(54) ELECTROLUMINESCENT DEVICE WITH IMPROVED HOLE TRANSPORT LAYER

(75) Inventors: Jianmin Shi, Webster; Ching W. Tang, Rochester, both of NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/207,703

(22) Filed: Dec. 9, 1998

(51) Int. Cl.[7] .............................................. H05B 33/00
(52) U.S. Cl. ................... 428/690; 313/504; 252/301.16
(58) Field of Search ................................ 428/690, 917; 252/301.16; 313/498, 502, 506, 504

(56) References Cited

U.S. PATENT DOCUMENTS

| | | | |
|---|---|---|---|
| 3,172,862 A | 3/1965 | Gurnee et al. ........... 252/301.3 |
| 3,173,050 A | 3/1965 | Gurnee et al. ............... 313/108 |
| 3,710,167 A | 1/1973 | Dresner et al. ......... 313/108 A |
| 4,356,429 A | 10/1982 | Tang .......................... 313/503 |
| 4,539,507 A | 9/1985 | VanSlyke et al. ........... 313/504 |
| 4,769,292 A | 9/1988 | Tang et al. .................. 428/690 |
| 5,061,569 A | 10/1991 | VanSlyke et al. ............ 428/457 |
| 5,141,671 A | 8/1992 | Bryan et al. ........... 252/301.16 |
| 5,366,811 A | 11/1994 | Higashi et al. .............. 428/457 |
| 5,540,999 A | * 7/1996 | Yamamoto et al. ....... 428/411.1 |
| 5,554,450 A | 9/1996 | Shi et al. ..................... 428/690 |
| 5,652,067 A | * 7/1997 | Ito et al. ...................... 428/690 |
| 5,766,779 A | 6/1998 | Shi et al. ..................... 428/690 |
| 5,776,622 A | 7/1998 | Hung et al. .................. 428/690 |
| 5,885,498 A | * 3/1999 | Matsuo et al. .............. 252/583 |
| 5,972,247 A | * 10/1999 | Shi et al. ..................... 252/583 |
| 5,989,737 A | * 11/1999 | Xie et al. .................... 428/690 |
| 6,043,510 A | * 3/2000 | Kawamoto ................... 257/40 |

OTHER PUBLICATIONS

Adachi et al, Organic Electroluminescent Device Having a Hole Conductor as an Emitting Layer, Appl. Phys. Lett 55 (15) Oct. 1989, pps. 1489–1491.

Dresner, Double Injection Electroluminescen in Anthracene, RCA Laboratories, Jun. 1969, pp. 322–334.

* cited by examiner

Primary Examiner—Cynthia H. Kelly
Assistant Examiner—Dawn Garrett
(74) Attorney, Agent, or Firm—Raymond L. Owens

(57) ABSTRACT

An organic electroluminescent device, including an anode and cathode and therebetween a hole transport layer; and an electron tranport layer disposed in an operative relationship with the hole transport layer; wherein the hole transport layer includes at least an aromatic hydrocarbon or fused hydrocarbon containing at least 20 carbon atoms and having an ionization potential greater than 5.0 eV.

4 Claims, 2 Drawing Sheets

ELECTROLUMINESCENT DEVICE WITH IMPROVED HOLE TRANSPORT LAYER

CROSS REFERENCE TO RELATED APPLICATIONS

Reference is made to commonly-assigned U.S. patent application Ser. No. 09/208,172 filed Dec. 9, 1998; pending entitled "Electroluminescent Device with Anthracene Derivatives Hole Transport Layer" by Shi et al; U.S. patent application Ser. No. 09/208,178 filed Dec. 9, 1998, now U.S. Pat. No. 6,041,24 entitled "Electroluminescent Device with Arylethylene Derivatives in Hole Transport Layer" by Shi et al; U.S. patent application Ser. No. 09/208,313 filed Dec. 9, 1998, now abandoned entitled "Electroluminescent Device with Polyphenyl Hydrocarbon Hole Transport Layer" by Shi et al; and U.S. patent application Ser. No. 09/191,705 filed Nov. 13, 1998 now abandoned, entitled "A Multistructured Electrode For Use With Electroluminescent Devices" by Hung et al, the disclosures of which are incorporated herein.

FIELD OF THE INVENTION

The present invention relates to organic electroluminescent devices.

BACKGROUND OF THE INVENTION

Organic electroluminescent devices are a class of opto-electronic devices where light emission is produced in response to an electrical current through the device. (For brevity, EL, the common acronym for electroluminescent, is sometimes substituted.) The term organic light emitting diode or OLED is also commonly used to describe an organic EL device where the current-voltage behavior is non-linear, meaning that the current through the EL device is dependent on the polarity of the voltage applied to the EL device. In this embodiment, the term EL and EL devices will include devices described as OLED.

Organic EL devices generally have a layered structure with an organic luminescent medium sandwiched between an anode and a cathode. The organic luminescent medium usually refers to an organic light emitting material or a mixture thereof in the form of a thin amorphous or crystalline film. Representatives of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. In these prior arts, the organic luminescent medium was formed of a conjugated organic host material and a conjugated organic activating agent having condensed benzene rings. Naphthalene, anthracene, phenanthrene, pyrene, benzopyrene, chrysene, picene, carbazole, fluorene, biphenyl, terpheyls, quarterphenyls, triphenylene oxide, dihalobiphenyl, trans-stilbene, and 1,4-diphenylbutadiene were offered as examples of organic host materials. Anthracene, tetracene, and pentacene were named as examples of activating agents. The organic luminescent medium was present as a single layer having a thickness much above 1 micrometer. The voltage required to drive the EL devices was as much as a few hundreds volts, thus the luminous efficiency of these EL devices was rather low.

In commonly-assigned U.S. Pat. No. 4,356,429, Tang further advanced the art of organic EL device by disclosing a bi-layer EL device configuration. The organic luminescent medium in this bi-layer configuration comprises of two extremely thin layers of organic film (<1.0 micrometer in combined thickness) sandwiched between the anode and cathode. The layer adjacent to the anode, termed the hole-transport layer, is specifically chosen to transport predominantly holes only in the EL device. Likewise, the layer adjacent to the cathode is specifically chosen to transport predominantly electrons only in the EL device. The interface or junction between the hole-transport layer and the electron-transport layer is referred to as the electron-hole recombination zone where the electron and hole recombine to produce electroluminescence with the least interference from the electrodes. This recombination zone can be extended beyond the interface region to include portions of the hole-transport layer or the electron-transport layer or both. The extremely thin organic luminescent medium offers reduced electrical resistance, permitting higher current densities for a given voltage applied on the EL device. Since the EL intensity is directly proportional to the current density through the EL device, this thin bi-layer construction of the organic luminescent medium allows the EL device to be operated with a voltage as low as a few volts, in contrast to the earlier EL devices. Thus, the bi-layer organic EL device has achieved a high luminous efficiency in terms of EL output per electrical power input and is therefore useful for applications such as flat-panel displays and lighting.

Commonly-assigned Tang U.S. Pat. No. 4,356,429 disclosed an EL device formed of an organic luminescent medium including a hole transport layer containing 1000 Angstroms of a porphyrinic compound such as copper phthalocyanine, and an electron transport layer of 1000 Angstroms of tetraphenylbutadiene in poly(styrene). The anode was formed of a conductive indium-tin-oxide (ITO) glass and the cathode was a layer of silver. The EL device emitted blue light when biased at 20 volts at an average current density in the 30 to 40 mA/cm$^2$ range. The brightness of the device was 5 cd/m$^2$.

Further improvements in the bi-layer organic EL devices were taught by commonly-assigned Van Slyke et al U.S. Pat. No. 4,539,507. Van Slyke et al realized dramatic improvements in EL luminous efficiency by substituting the porphyrinic compounds of Tang in the hole-transport layer with an amine compound. With an aromatic tertiary amine such as 1,1-bis(4-di p-tolylaminophenyl)cyclohexane as the hole-transport layer and an electron transport layer of 4,4'-bis(5, 7-di-t-pentyl-2-benzoxazolyl)-stilbene, the EL device was capable of emitting blue-green light with a quantum efficiency of about 1.2% photon per injected charge when biased at about 20 volts.

The use of aromatic amines as the material for the hole-transport layer in organic EL devices has since been generally recognized as numerous prior arts have disclosed the utility of various classes of amines in enhancing the EL device performance. Improvements in the hole-transport material parameters include higher hole transport mobility, more amorphous structures, higher glass transition temperature, and better electrochemical stability. Improvements in the organic EL devices with these improved amines include higher luminous efficiency, longer operational and storage life, and a greater thermal tolerance. For example, the improved arylamine hole transport materials have been disclosed in commonly-assigned U.S. Pat. No. 5,061,569 by VanSlyke et al. A series of aromatic amines with glass transition temperature as high as 165° C. designed for high temperature EL devices has been disclosed in commonly-assigned U.S. Pat. No. 5,554,450 by Shi et al. A π-conjugated starburst molecule 4,4',4"-tris(3-methylphenylamino) triphenylamine (m-MTDATA), which forms a stable amorphous glass and functions as an excellent hole transport material, was disclosed in U.S. Pat. No. 5,374,489 by Shirota et al.

The use of organic compounds outside the aromatic amines class for the hole-transport layer in organic EL devices is not common, given the well-known hole-transport properties of the aromatic amines. However, there is a significant disadvantage of using aromatic amines as the hole-transport layer in the bi-layer EL device. Since amines are generally strong electron donors, they can interact with the emissive materials used in the electron-transport layer, resulting in the formation of fluorescence quenching centers and a reduction in the EL luminous efficiency.

SUMMARY OF THE INVENTION

It is an object of the present invention to provide organic compounds outside the class of aromatic amines as the hole transport layer in organic EL devices, which result in enhanced EL performance.

This object is achieved in an organic electroluminescent device, comprising:

an anode and cathode and therebetween a hole transport layer; and an electron tranport layer disposed in an operative relationship with the hole transport layer; wherein:

the hole transport layer includes at least an aromatic hydrocarbon or fused aromatic hydrocarbon containing at least 20 carbon atoms and having an ionization potential greater than 5.0 eV.

Representative examples of the hole transport layer material include:

a) Anthracene derivatives of formula I:

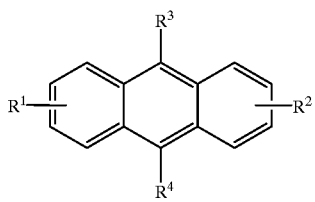

wherein:
substituents $R^1$, $R^2$, $R^3$ and $R^4$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group;

b) Arylethylene and arylacetylene derivatives of formulae II, III, IV, and V:

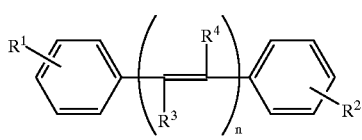

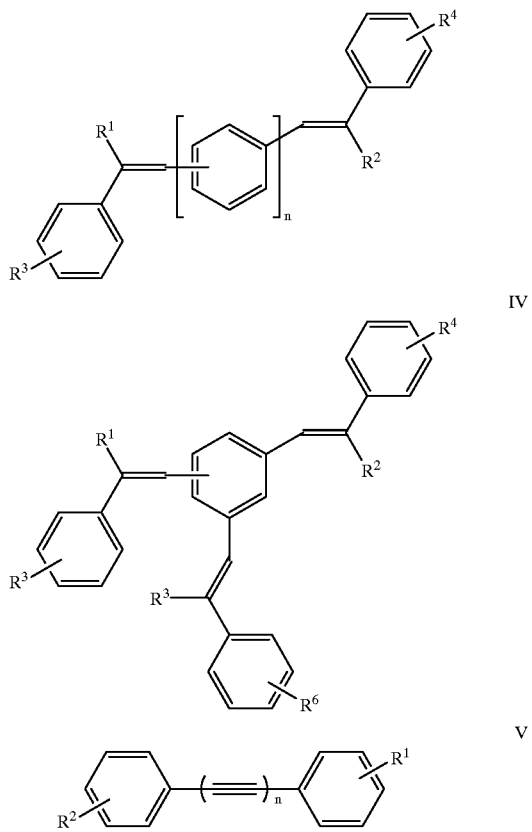

wherein:
n is integer from 1 to 6;
substituents $R^1$, $R^2$, $R^3$, $R^4$, $R^5$ and $R^6$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group; and c) polyphenyl hydrocarbons of formula VI:

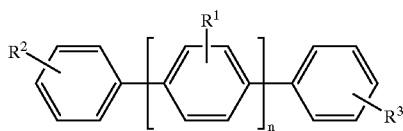

wherein:
n is integer from 1 to 6;
substituents $R^1$, $R^2$ and $R^3$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group.

Aromatic hydrocarbon or fused aromatic hydrocarbon that are used in the hole transporting layer have the feature that do not need to include alkylamino- or arylamino-moieties;

The aromatic hydrocarbon or fused aromatic hydrocarbon in accordance with the present invention have an ionization potential larger than 5.0 eV.

Quite unexpectedly, it has been found that hole transport layers in accordance with the present invention that have an ionization potential greater than 5.0 eV effectively work with the electron transport layer or an emissive layer or an electron transport layer which also functions as an emissive layer to provide a highly efficient electroluminescent device.

DETAILED DESCRIPTION OF THE PREFERRED EMBODIMENTS

Figure 1:
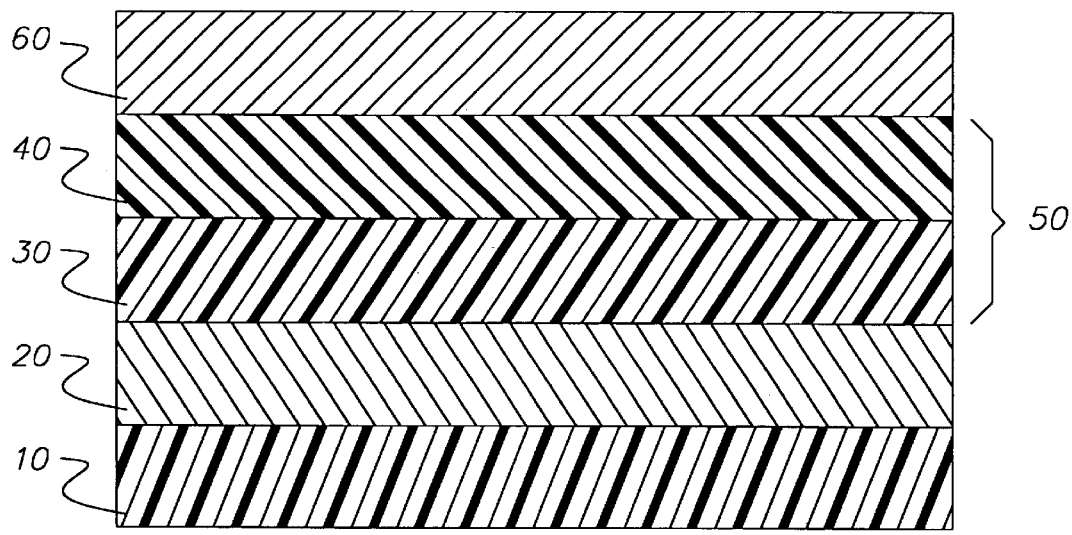
FIG. 1 illustrates the cross-section of a bi-layer organic EL device.

FIG. 1 illustrates the basic structure used in the construction of organic EL device of this invention. It is a bi-layer structure comprising an organic hole transport layer 30 and an organic electron transport layer 40. The electron transport layer is also the emissive layer from which electroluminescence originates. Together, they form the organic EL medium 50. The anode 20 is adjacent to the hole transport layer and the cathode 60 is adjacent to the electrode transport layer. The substrate is layer 10. This figure is for illustration only and the individual layer thickness is not scaled according to the actual thickness.

Figure 2:
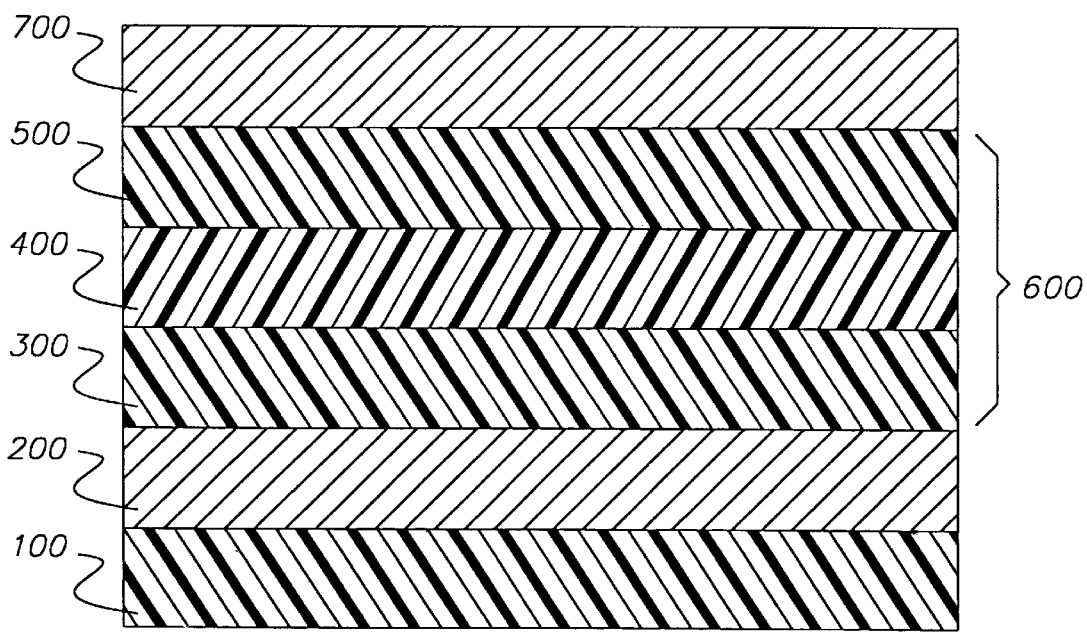
FIG. 2 illustrates the cross-section of an EL device with a modified bi-layer structure.

FIG. 2 illustrates an alternative construction of the organic EL device of this invention. It is a modified bi-layer structure. The EL medium contains an emissive layer between the hole transport layer and the electron transport layer. This emissive layer is the layer from which electroluminescence originates. Thus, layer 300 is the hole transport layer, layer 400 is the emissive layer, layer 500 is the electron transport layer, and together they form the electroluminescent medium 600. Layer 200 is the anode and layer 700 is the cathode. The substrate is layer 100. This figure is for illustration only and the individual layer thickness is not scaled according to the actual thickness.

Figure 3:
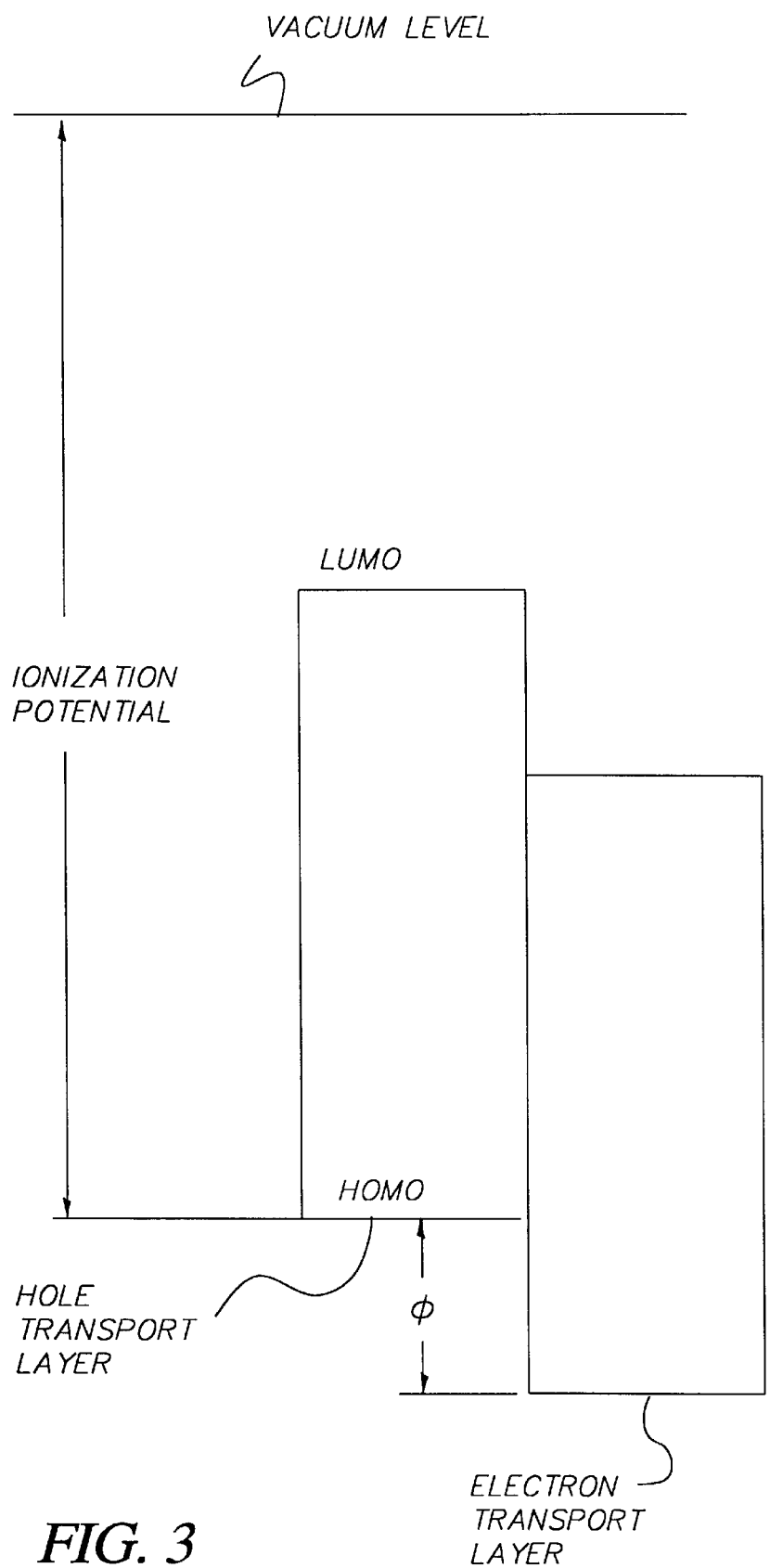
FIG. 3 illustrates the energy level diagram of an organic EL device with a bi-layer structure as described in FIG. 1.

FIG. 3 illustrates the energy level diagram of an organic EL device with a bi-layer structure as described in FIG. 1. The organic EL medium is represented by a hole-transport layer with a characteristic low ionization potential energy, and an electron transport layer with a relatively higher ionization potential energy. The ionization potential energy or ionization potential (IP) for a molecular solid is defined as the energy difference between the vacuum level and the highest occupied molecular orbital (HOMO) level of the solid. The vacuum level is usually referred to as the reference level from which the energy levels of the molecular solid are measured. The HOMO is the highest energy level filled with electron and in which the hole is free to move. Similarly, the lowest unoccupied molecular orbital (LUMO) is the lowest energy level devoid of electron and in which free electron is free to move. The energy difference between HOMO and LUMO is the bandgap within which there are no available molecular orbital states. The IP value is a measure of the minimum energy required to remove an electron from the molecular solid and can be easily obtained experimentally by photoemission techniques which have been well described in the literature.

The bi-layer structure as illustrated in FIG. 1 is designed to confine the electron hole recombination at the interface between the hole transport layer and the electron transport layer. This confinement is accomplished by establishing either an electron injection barrier or a hole injection barrier or both at the interface. Referring to the hole injection barrier, it is the difference between the HOMO levels of the hole transport and electron transport layers, as indicated by the symbol, $\phi$, in FIG. 3. For large $\phi$ values, >0.5 eV, the hole migrating through the hole transport layer towards the interface will be unable to overcome the potential energy barrier and will thus be trapped at the hole transport layer side of the interface. Likewise, the electron injection barrier is the difference between the LUMO levels and a large electron injection barrier for electron injection will localize the electron at the electron transport layer side of the interface. As a result of these charge localizations created by a proper choice of the hole transport and electron transport materials, the electron hole pair will tend to recombine at the interface producing electroluminescence which is characteristics of the interface.

Conventional hole transport materials used in EL devices are mostly arylamines because their hole mobility is among the highest found in common organic materials. Materials with a high mobility are desirable for current-driven devices such as organic EL as the voltage require to operate the device will be low. The arylamines are also known to have the lowest ionization potentials among organic materials. Thus, for creating a hole injection barrier between the hole transport layer and the electron transport layer in a bi-layer EL device, arylamines are appropriate. Highly efficient EL devices have been produced using a variety of arylamines as the hole transport layer.

A class of arylamines found particularly useful in organic EL devices is represented by formula VII:

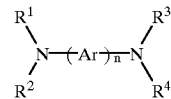

VII wherein

Ar is an arylene group, and arylene moieties are preferably phenyl and phenylene moieties.

n is an integer of from 1 to 4, and $R^1$, $R^2$, $R^3$ and $R^4$ are independently selected aryl groups.

These arylamines are particularly useful as the hole transport material in EL devices.

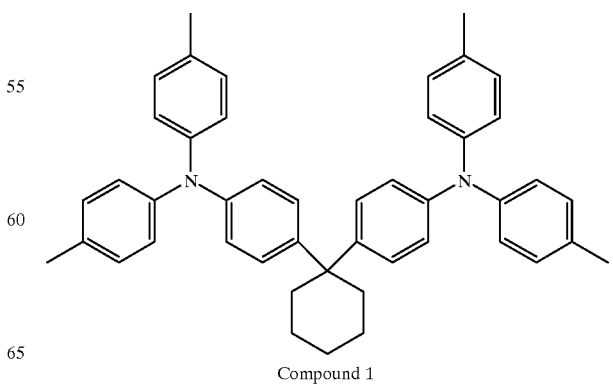

Compound 1

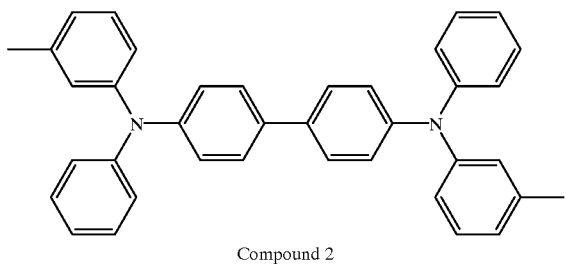

Compound 2

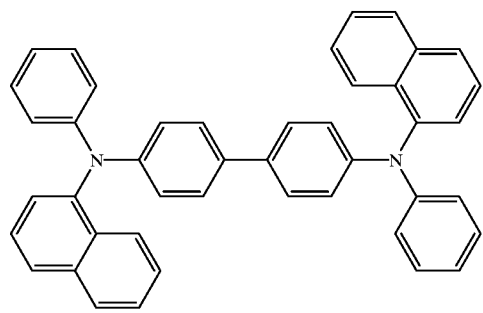

Compound 3

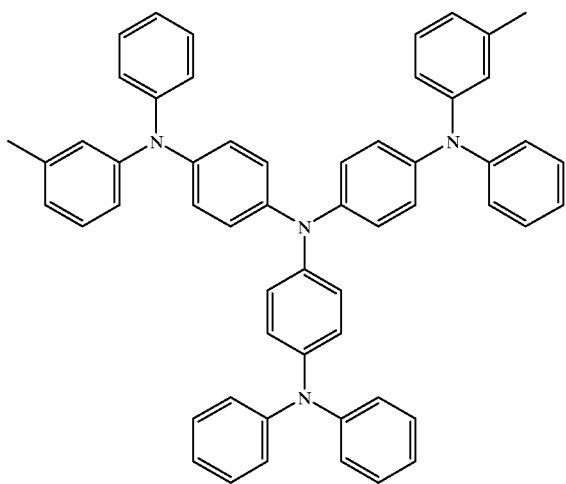

Compound 4

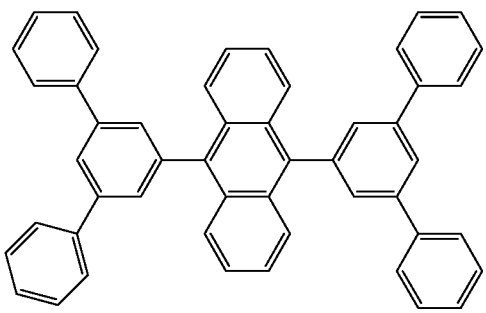

Compound 5

Although arylamines are useful as hole transport materials in EL devices, they do have a number of deficiencies. First, as a class of organic materials, they are relatively strong electron donors, meaning that they can be easily oxidized and therefore are unstable in amibient environments. Second, when used as a hole transport layer adjacent to an electron transport layer in an EL device, the arylamines may interact with the electron transport layer to produce non-emissive centers which will result in a loss of electroluminescence. Third, because of the low ionization potential of the arylamines, the hole injection barrier formed between the arylamine hole transport layer and the electron transport layer will cause the holes to localize in the arylamines which will also result in a loss of electroluminescence. For these reasons, new hole transport materials are useful to further improve the EL device performance.

The new hole transport materials in this invention include aromatic hydrocarbons or fused aromatic hydrocarbons with a molecular structure containing at least 20 carbon atoms and have an ionization potential greater than 5.0 eV;

A representative class of the hole transport materials includes anthracene derivatives of formula I:

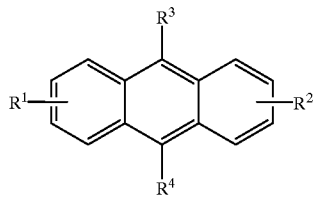

I wherein:

substituents $R^1$, $R^2$, $R^3$ and $R^4$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group.

The following molecular structures constitute specific examples of anthracene derivatives represented by the general formula I. These compounds are particularly useful as the hole transport material in EL devices.

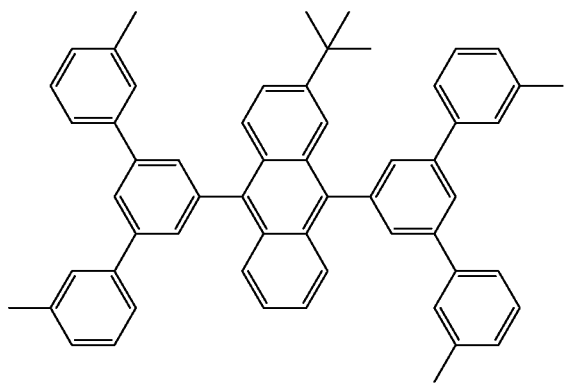

Compound 6

-continued
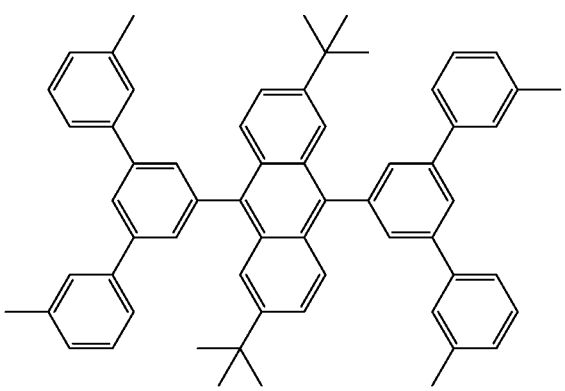
Compound 7
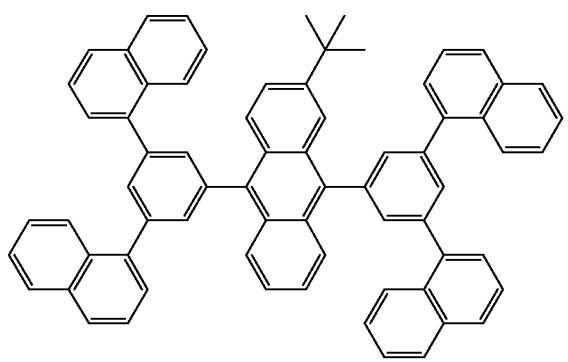
Compound 8
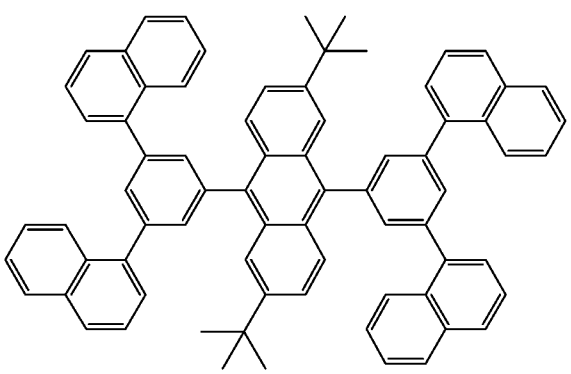
Compound 9
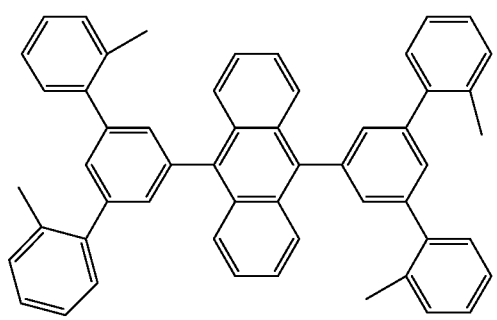
Compound 10
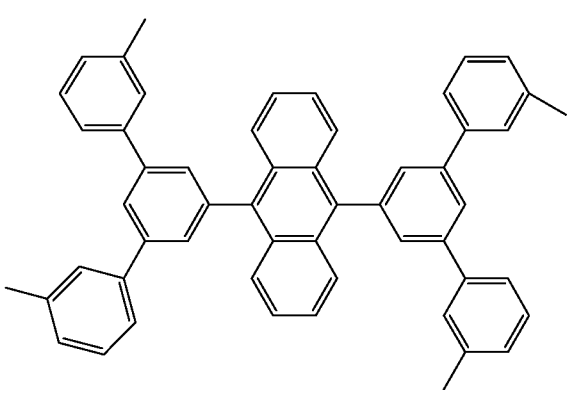
Compound 11
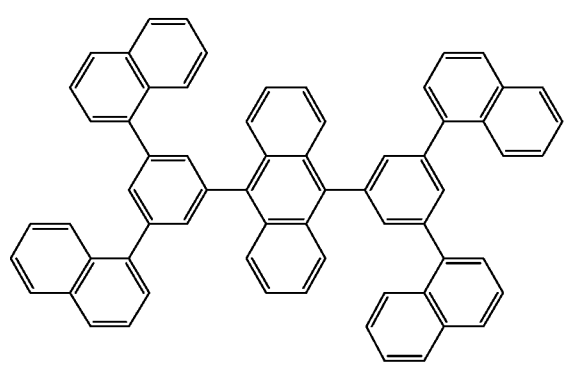
Compound 12
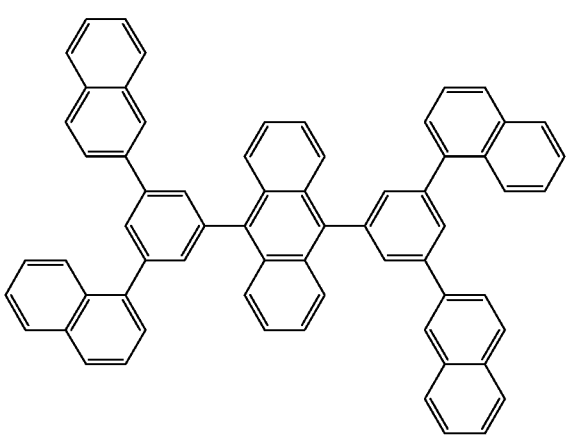
Compound 13
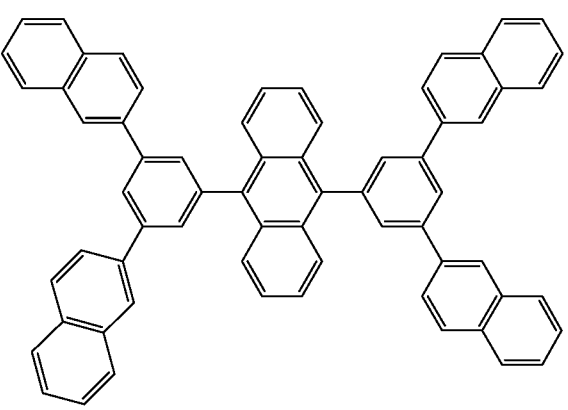
Compound 14

-continued
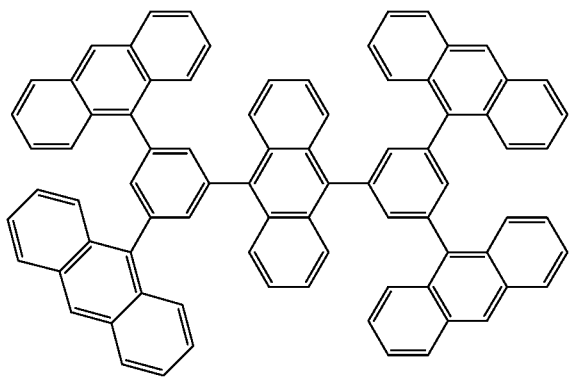
Compound 15
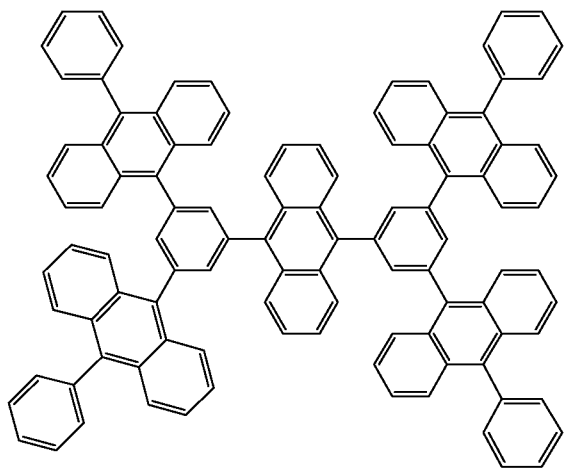
Compound 16
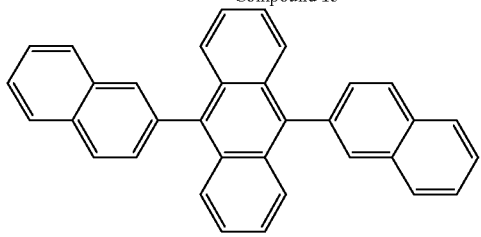
Compound 17
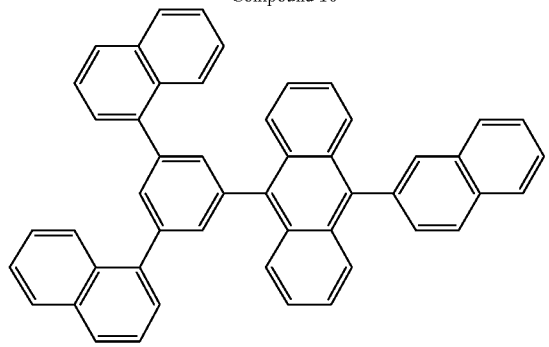
Compound 18
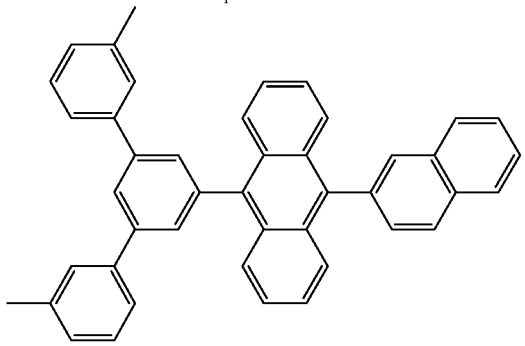
Compound 19
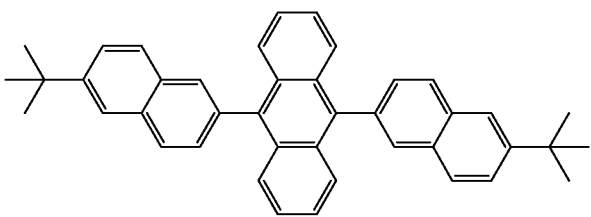
Compound 20
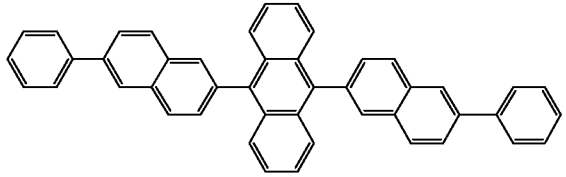
Compound 21
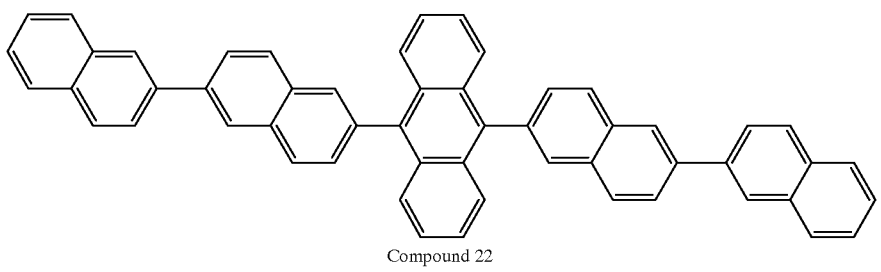
Compound 22

-continued
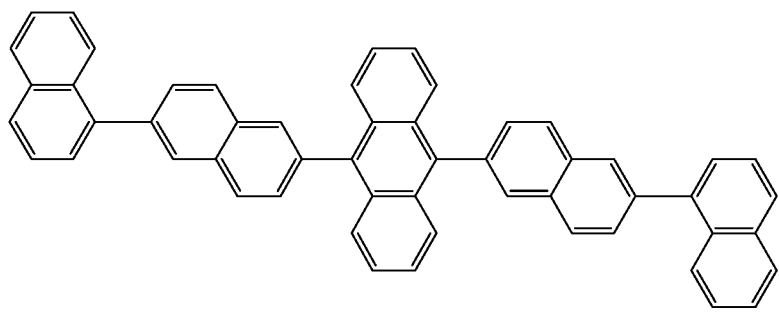
Compound 23
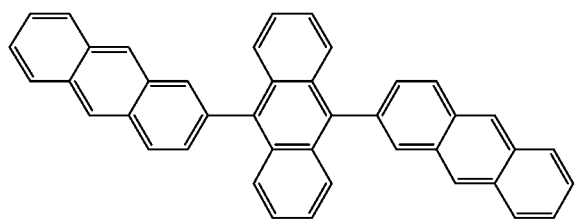
Compound 24
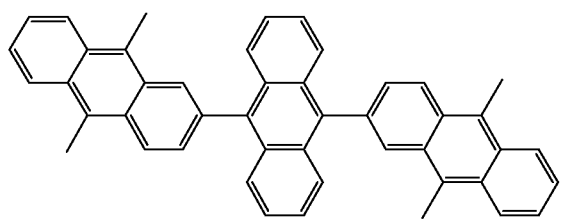
Compound 25
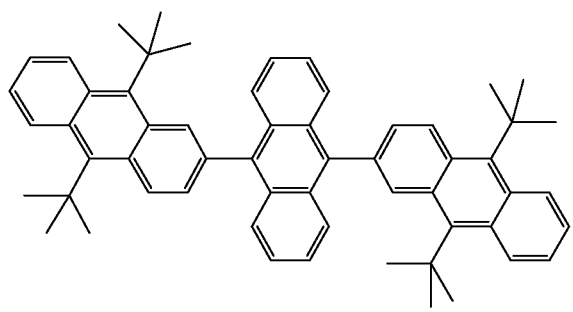
Compound 26
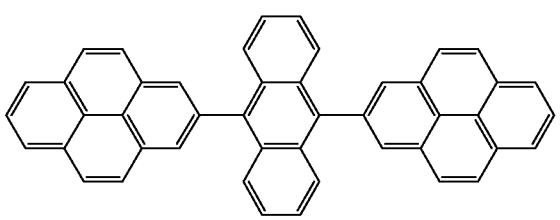
Compound 27
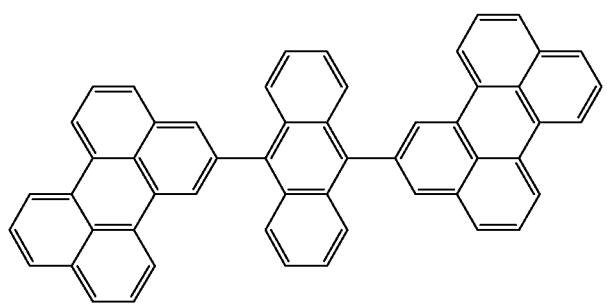
Compound 28
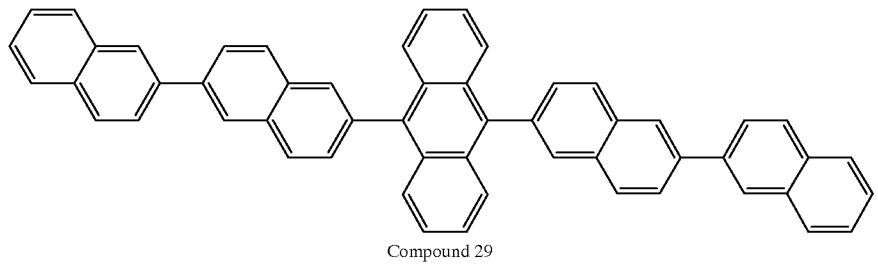
Compound 29

-continued
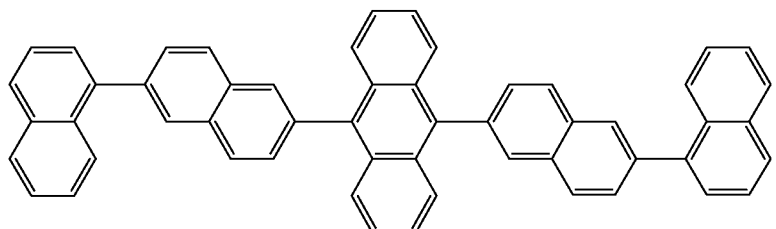
Compound 30
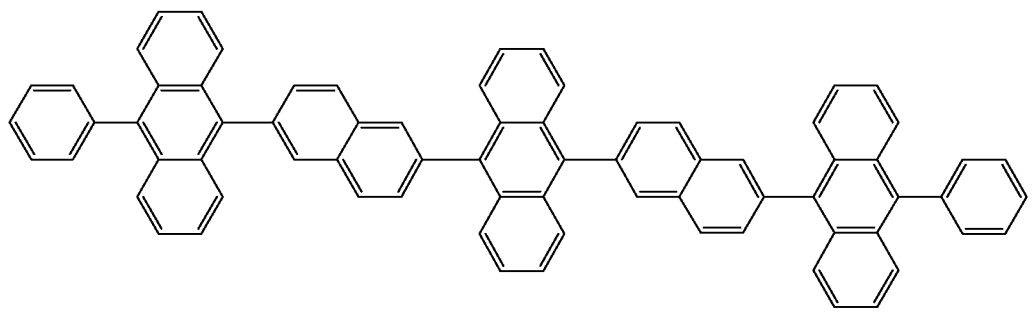
Compound 31
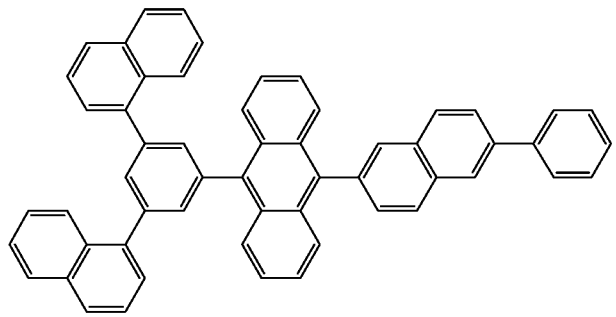
Compound 32
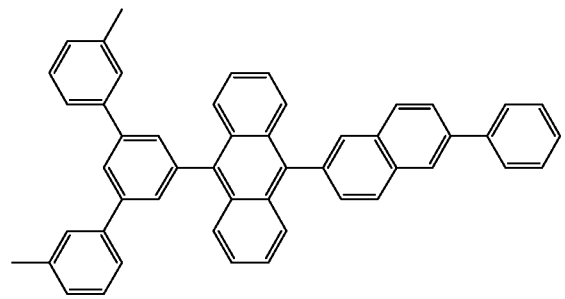
Compound 33
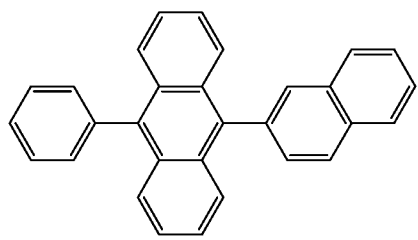
Compound 34
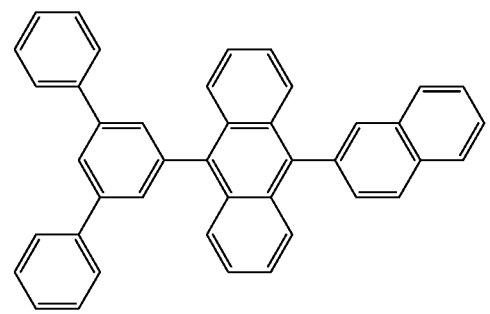
Compound 35
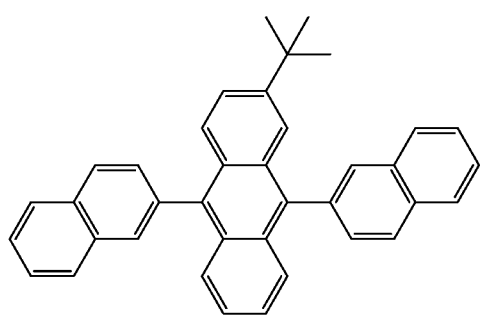
Compound 36
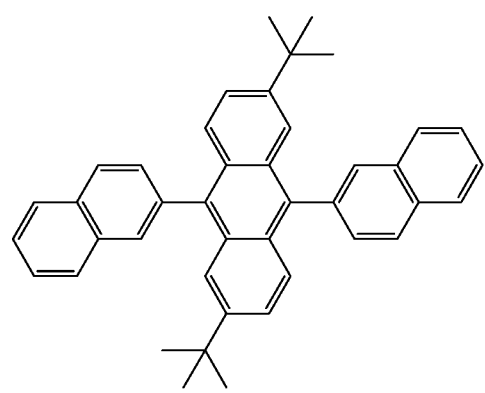
Compound 37

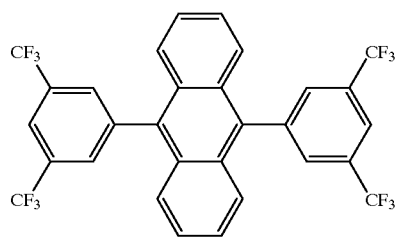
Compound 38
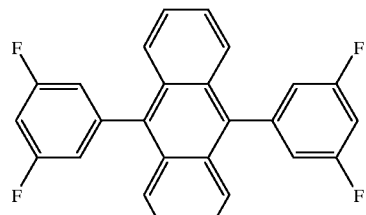
Compound 39
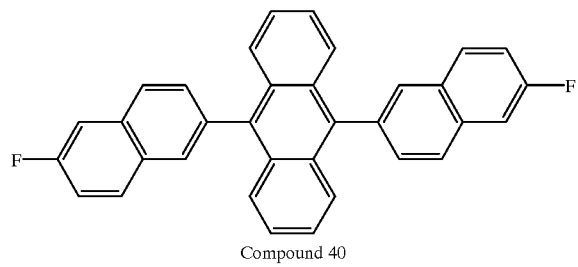
Compound 40
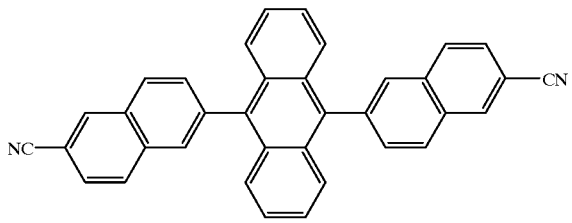
Compound 41
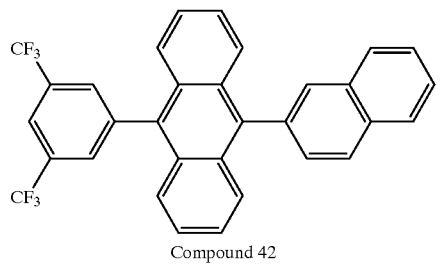
Compound 42
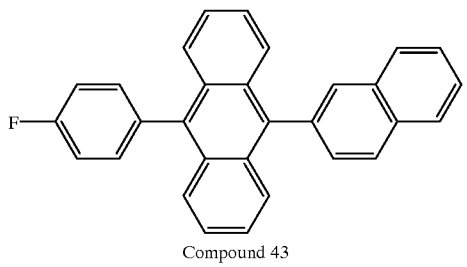
Compound 43
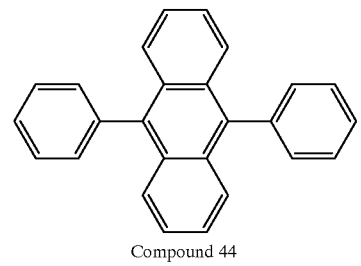
Compound 44
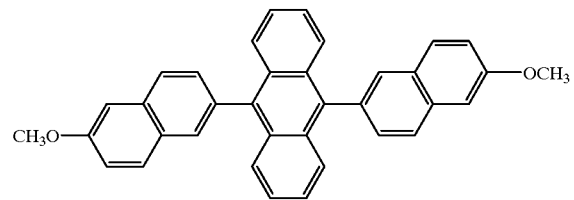
Compound 45
Another representative class of the hole transport materials of this invention includes arylethylene and arylacetylene derivatives of formula II, III, IV and V.
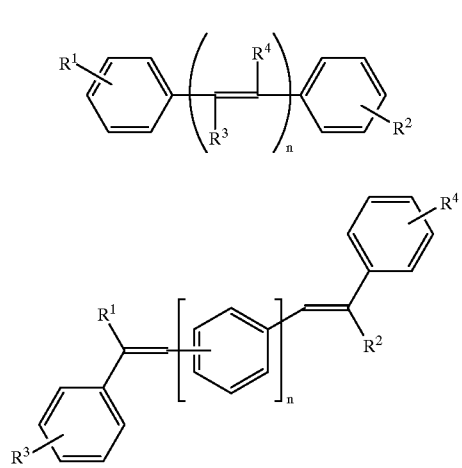
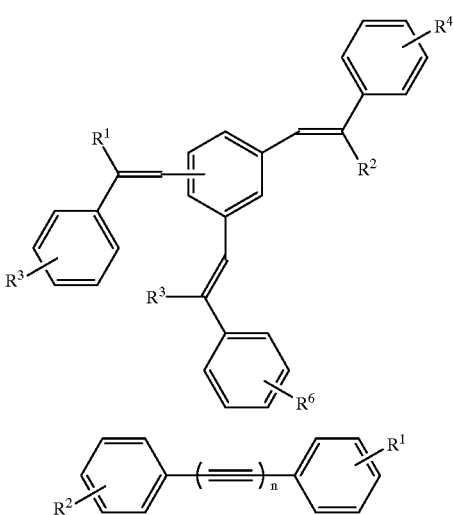

wherein:
n is integer from 1 to 6;
substituents $R^1$, $R^2$, $R^3$, $R^4$, $R^5$ and $R^6$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group.

The following molecular structures constitute specific examples of arylethylene and arylacetylene derivatives represented by the general of formula II, III, IV, and V. These compounds are particularly useful as the hole transport material in EL devices.

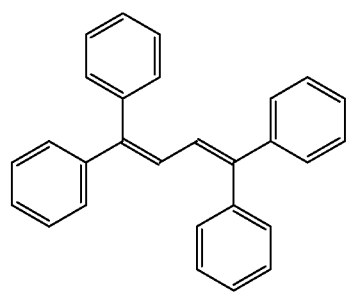

Compound 46

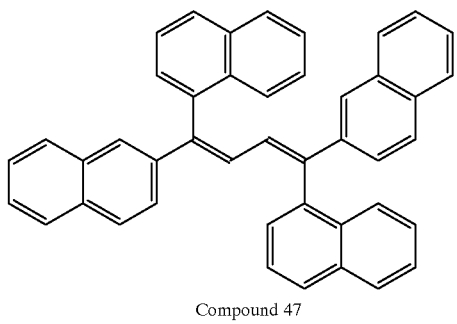

Compound 47

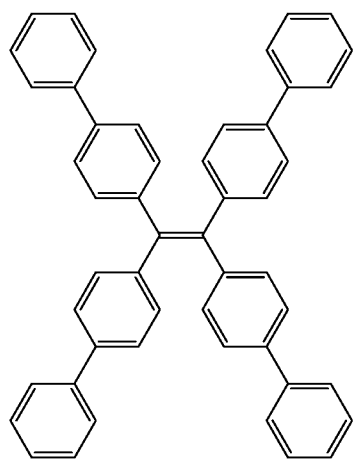

Compound 48

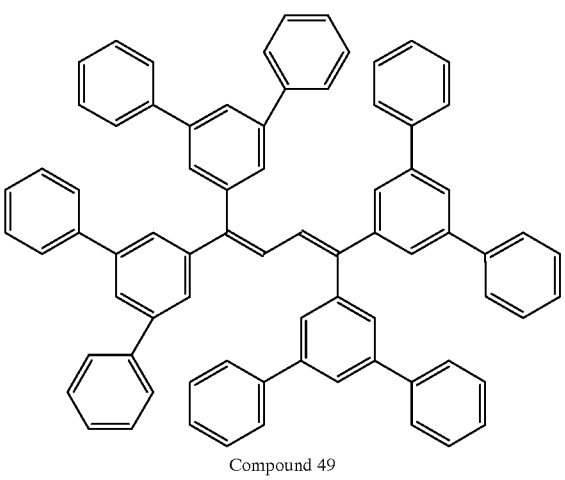

Compound 49

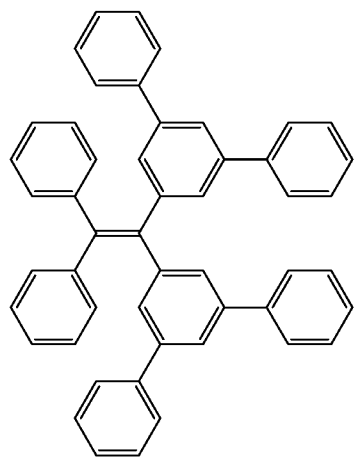

Compound 50

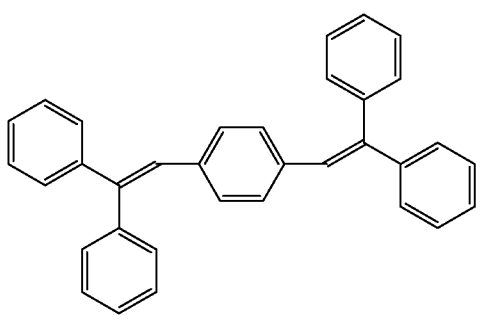

Compound 51

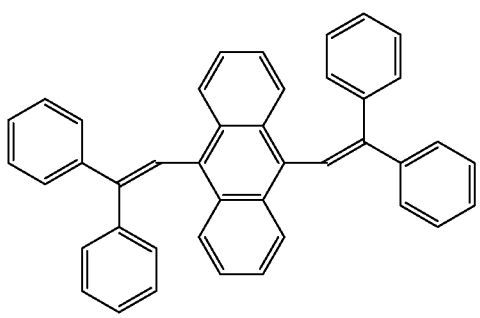

Compound 52

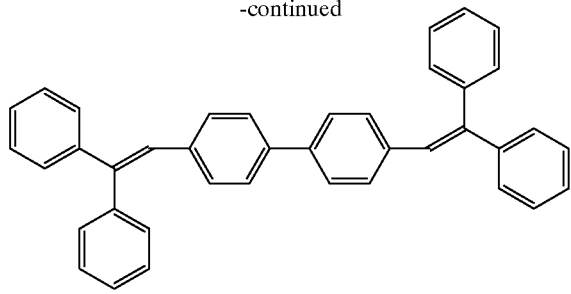
Compound 53
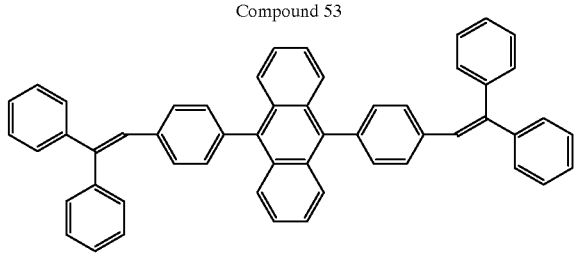
Compound 54
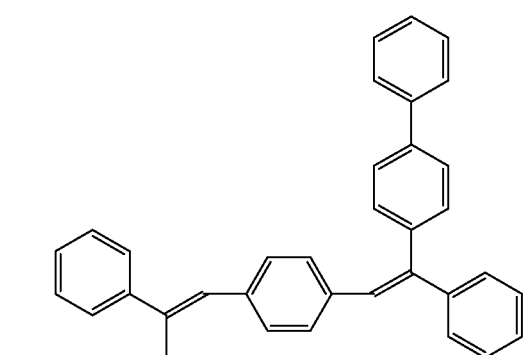
Compound 55
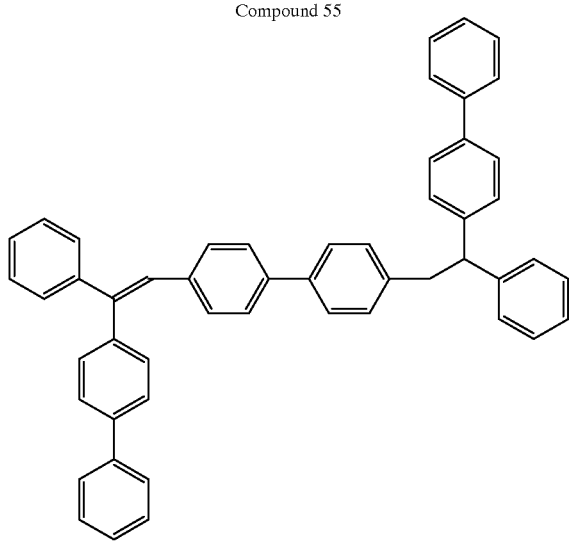
Compound 56
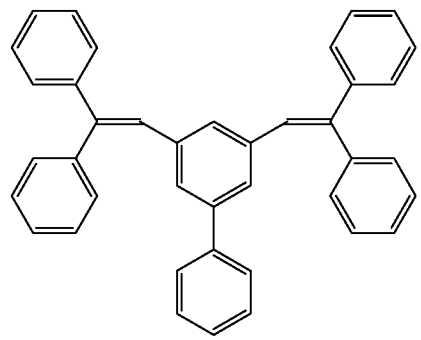
Compound 57
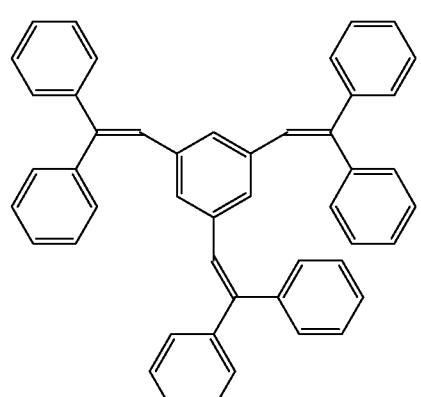
Compound 58
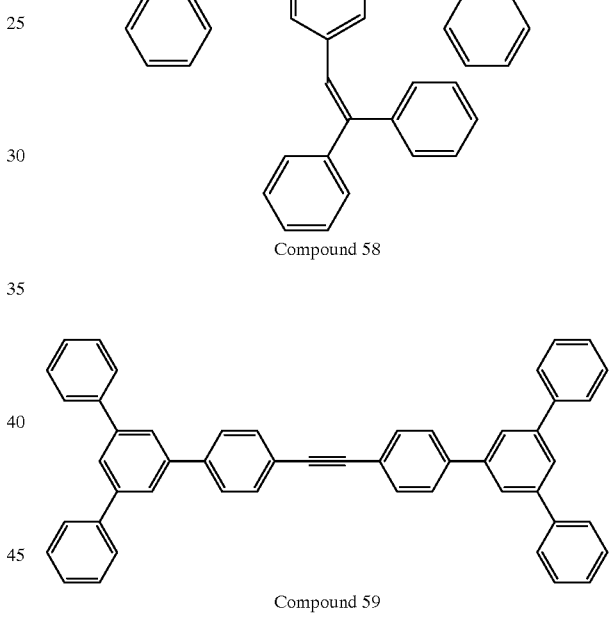
Compound 59
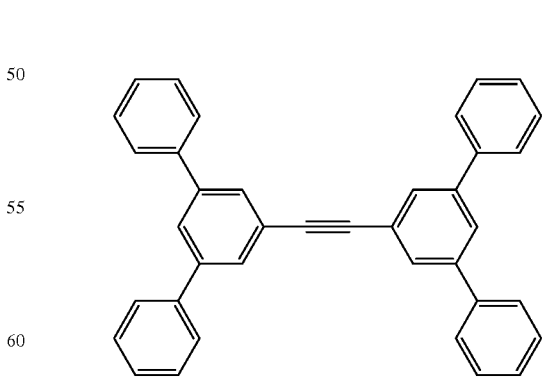
Compound 60
Another representative class of the hole transport materials of this invention includes polyphenyl hydrocarbons of formula VI:

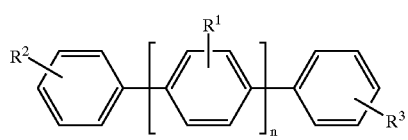

wherein:

n is integer from 1 to 6;
substituents $R^1$, $R^2$ and $R^3$ are each individually hydrogen, or alkyl of from 1 to 24 carbon atoms; aryl or substituted aryl of from 5 to 28 carbon atoms; or heteroaryl or substituted heteroaryl of from 5 to 28 carbon atoms; or fluorine, chlorine, bromine; or cyano group.

The following molecular structures constitute specific examples of polyphenyl hydrocarbons represented by the general formula VI. These compounds are particularly useful as the hole transport material in EL devices.

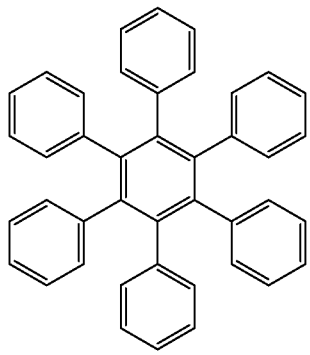

Compound 61

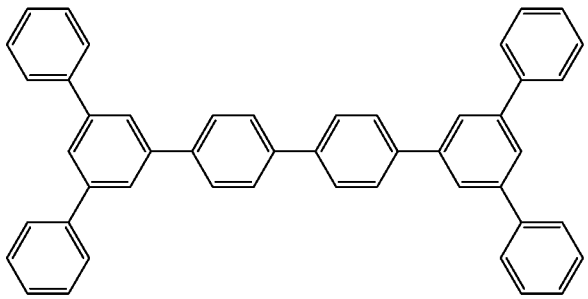

Compound 62

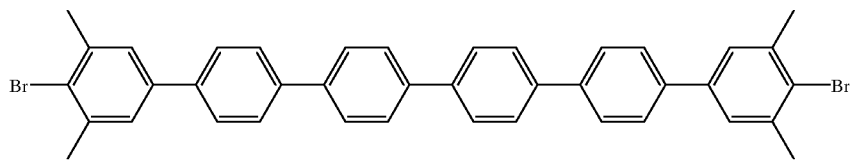

Compound 63

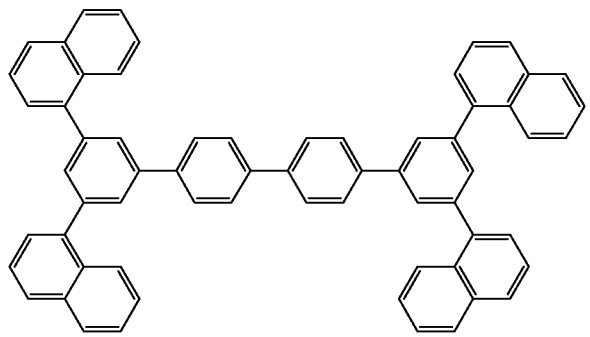

Compound 64

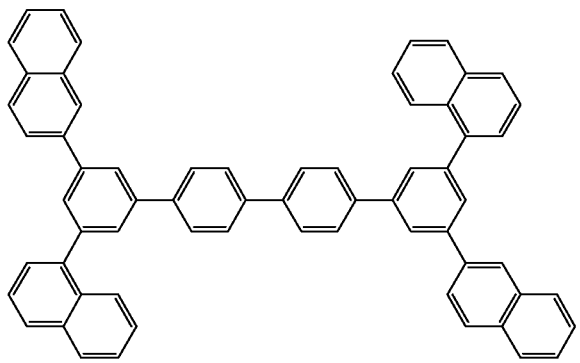

Compound 65

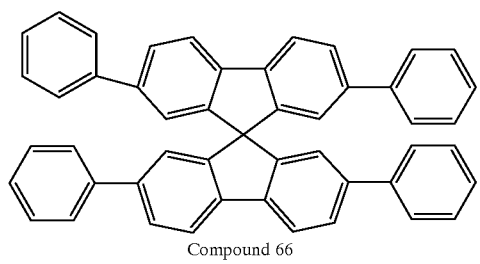

Compound 66

The ionization potentials of some of these aromatic hydrocarbon hole transport materials have been measured and their values are compared with the arylamine hole transport materials as follows. It is noted that the aromatic hydrocarbon hole transport materials generally have a higher ionization potential than the arylamines.

| Arylamines and aromatic hydrocarbons | IP (eV) |
|---|---|
| 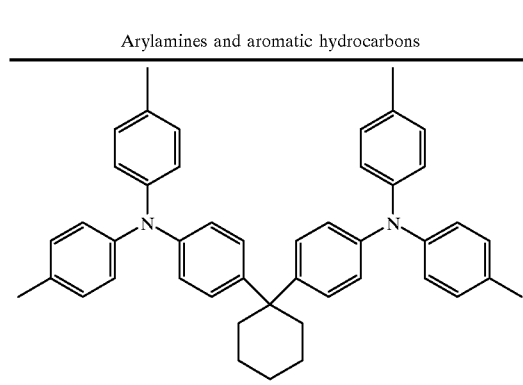  Compound 1 | 5.2 |
| Compound 2 | 5.3 |
| Compound 3 | 5.4 |
| 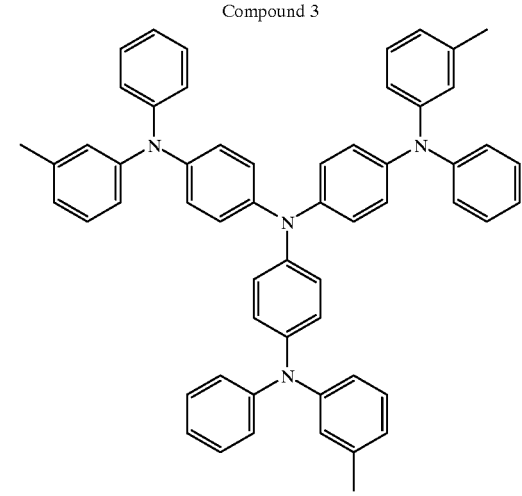  Compound 4 | 5.1 |

-continued

| Arylamines and aromatic hydrocarbons | IP (eV) |
|---|---|
| Compound 11 | 5.9 |
| Compound 12 | 5.9 |
| Compound 17 | 5.8 |
| Compound 45 | 5.8 |
| Compound 53 | 5.9 |

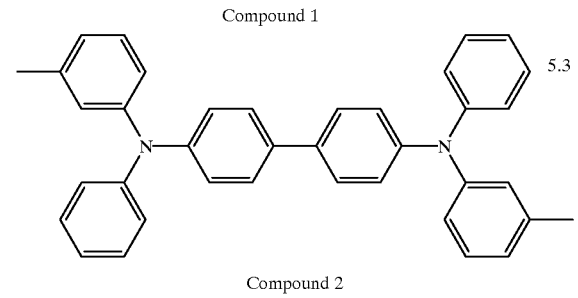

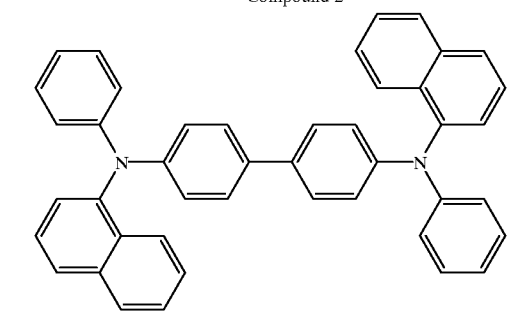

| Arylamines and aromatic hydrocarbons | IP (eV) |
|---|---|
| 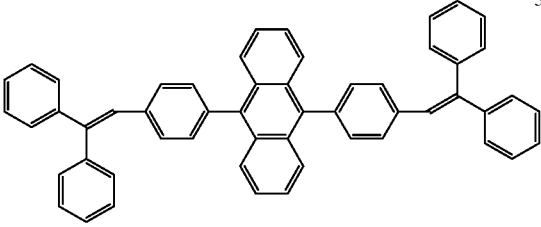<br>Compound 54 | 5.8 |

A higher ionization potential for the hole transport material is more favorable for hole injection from the hole transport layer to the electron transport layer in a bi-layer EL device resulting in a lower hole injection barrier and consequently a higher EL luminous efficiency. A preferred range for the ionization potentials is 5.0 eV or higher. An alternative criteria is that it should be as high as the ionization potential of the electron transport material in the bi-layer EL device.

A hole transport material with a high ionization potential is preferred in a bi-layer EL device because it will minimize the potential barrier for hole injection from the hole transport layer to the electron transport layer. Consequently, holes will be able to cross over the barrier requiring little or no activation energy and recombine with the electrons present in the electron transport layer to produce electroluminescence. Thus, a criteria for the ionization potential for the hole transport material is that it should be as high as the ionization potential of the electron transport material used in the bi-layer EL device. Electron-transport materials used in organic EL devices generally have ionization potentials greater than 5.0 eV. For example, Alq, a well-known electron-transport and emissive material, has an ionization potential of 5.7 eV. Values of ionization potentials for other known electron transport materials are as follows: 5.9 eV for PBD of diazole derivatives, C. Adachi et al., Appl. Phys. Lett. 55 (15), 9, pgs. 1489–1491, October 1989; 6.1 eV for TPBI of arylbenzimidizoles, commonly assigned U.S. Pat. No. 5,766,799 to Shi et al. Thus, a useful range for the ionization potential of the hole-transport material is 5.0 eV or greater.

In forming the hole transport layer of the organic EL device, the hole transport materials of this invention can be deposited by a number of methods. The preferred method is by vacuum vapor deposition as these aromatic hydrocarbons have good thermal stability and can be sublimed into thin film. Alternately, they can be dissolved in appropriate solvents and be cast into layers or thin films. Other deposition methods such as printing by the inkjet method, thermal transfer, laser abrasion and sputtering are useful.

The bi-layer EL device is the basic structure providing high luminous efficiencies and low-voltage operation. Alternative EL device structures have been demonstrated providing improved device performance. These alternative device structures include features in addition to the basic bi-layer structure such as the following structure (a) hole injection layer as disclosed in U.S. Pat. No. 4,356,429; (b) cathode modification with alkaline or alkaline halides as disclosed in U.S. Pat. No. 5,776,622; (c) anode modification with plasma-deposited flurocarbons as disclosed in the above cited commonly assigned U.S. patent application Ser. No. 09/191,705 to Hung et al and (d) doped emitter layer inserted between the hole transport and electron transport layer as disclosed in U.S. Pat. No. 4,769,292. These EL device structures retain the hole transport layer as one the component of the electroluminescent medium. Therefore, the aromatic hydrocarbon or fused hydrocarbon hole transport materials disclosed in this invention are applicable to these EL device structures as well.

A preferred EL device structure comprises an anode, a hole transport layer, an emissive layer, and an electron transport layer. In this preferred EL structure, the emissive layer is capable of transporting electrons as well, thus it can be considered as an electron transport layer with the added function of being highly luminescent. The principle function is to provide efficient emissive centers for electroluminescence. This emissive layer comprises a host material doped with one or more fluorescent dyes (FD). The fluorescent dye is usually present in an amount on the order of a few molar percent or less of the host material and it is sufficient to cause the EL emission to be predominantly that of the fluorescent dye. Using this method, highly efficient EL devices can be constructed. Simultaneously, the color of the EL devices can be tuned by using fluorescent dyes of different emission wavelengths. By using a mixture of fluorescent dyes, EL color characteristics of the combined spectra of the individual fluorescent dyes are produced. This dopant scheme has been described in considerable details for EL devices by Tang in commonly-assigned U.S. Pat. No. 4,769,292.

An important relationship for choosing a fluorescent dye as a dopant capable of modifying the hue of light emission when present in a host material is a comparison of their bandgap potential which is defined as the energy difference between the highest occupied molecular orbital and the lowest unoccupied molecular orbital of the molecule.

Preferred host materials for the emissive layer of the organic EL device disclosed in this invention are metal chelated oxinoid compounds, including chelates of oxine itself (also commonly referred to as 8-quinolinol or 8-hydroxyquinoline or Alq). Another class of preferred host materials is a mix ligand 8-quinolinolato aluminum chelates which have been disclosed in U.S. Pat. No. 5,141,671. Another class of preferred host materials is distrylstibene derivatives as disclosed in U.S. Pat. No. 5,366,811.

For efficient energy transfer from the host to the dopant molecule, a necessary condition is that the band gap of the dopant is smaller than that of the host material. Preferred fluorescent dyes used as the dopant in the emissive layer include coumarins, stilbenes, distrylstilbenes, derivatives of anthracene, tetracene, perylenes, rhodamines, and arylamines.

The molecular structures of the preferred fluorescent dyes for the emissive layer in the EL device are listed as follows:

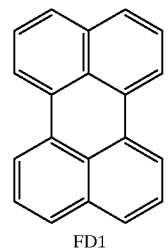
FD1

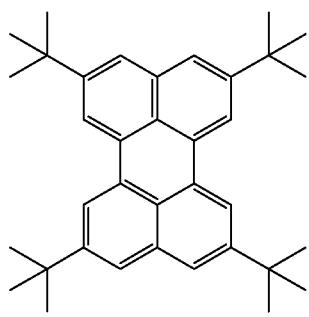

FD2

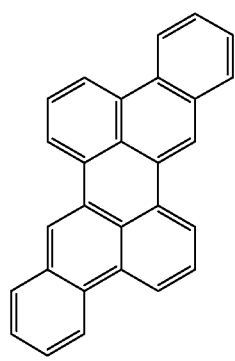

FD3

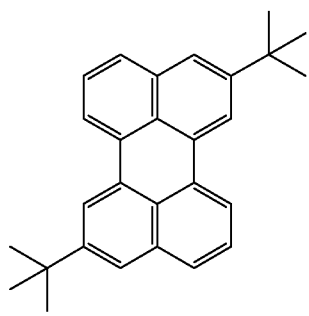

FD4

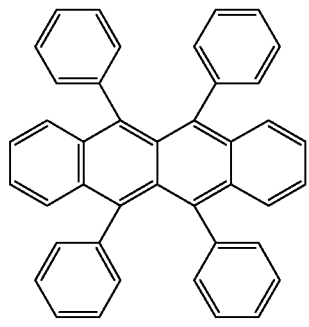

FD5

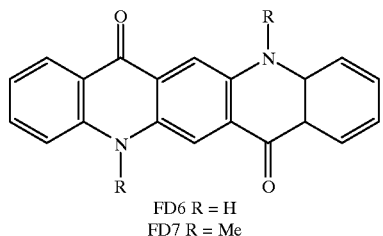

FD6 R = H
FD7 R = Me

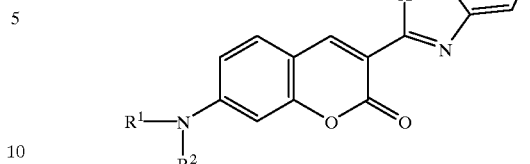

FD8 X = O, $R^1 = R^2$ = Alkyl
FD9 X = S, $R^1 = R^2$ = Alkyl

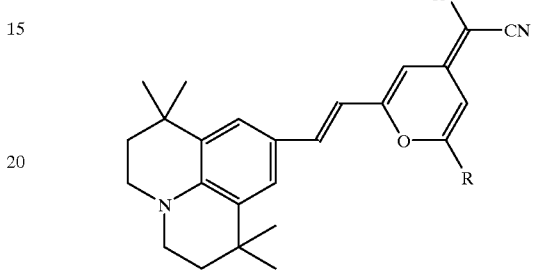

FD10 R = Ph
FD11 R = Me
FD12 R = t-Bu
FD13 R = Mesityl

Preferred materials for use in forming the electron transporting layer of the organic EL device are metal chelated oxinoid compounds, including chelates of oxine itself (also commonly referred to as 8-quinolinol or 8-hydroxyquinoline). Representative compounds are 8-hydroquinoline of the group III metals such as Al, In, Mg; and of the group II metals such as Mg, Zn; and of the group I metal such as Li.

Preferred materials for use in forming the anode of the EL device of this invention are indium tin oxide or an anode modified with fluorocarbons as disclosed in the above disclosed commonly-assigned U.S. patent application Ser. No. 09/191,705 to Hung et al.

Preferred materials for use in forming the cathode of the EL devices of this invention are Mg, Li, or alloys of these materials as disclosed in U.S. Pat. No. 5,429,884; and commonly-assigned U.S. Pat. No. 5,776,622 by Tang, Hung and others.

EXAMPLES

The invention and its advantages are further illustrated by the specific examples as follows:

Example 1

Synthesis of 3,5-(diphenyl)bromobenzene

To a solution of 1,3,5-tribromobenzene (60.0 g, 0.19 mol) in 300 mL of dry tetrahydrofuran (THF) was added 0.5 g of bis-(triphenylphosphine)-palladium(II) chloride under nitrogen. After the solution was purged with dry nitrogen for 5 minutes, 175 mL of phenylmagnesium chloride (2.0 M in THF) was added through an addition funnel at room temperature under nitrogen. The reaction mixture was stirred overnight. Then it was quenched by slowly adding 50 mL of 0.5 N HCl with stirring. The solvents were removed via a rotary evaporator. The residue was dissolved in heptane and washed with 0.1 M HCl followed by water. After removal of solvents, crude residues were purified by chromatography on silica gel using 3% methanol in dichloromethane as eluents. After drying, 18.0 g of pure 3,5-(diphenyl) bromobenzene was collected, yielding 30.0%.

Example 2

Synthesis of 9,10-di-(3,5-diphenyl)phenyl anthracene (Compound 5)

To a suspension of 6.5 g (0.02 mol) of 9,10-dibromoanthracene and 0.5 g of bis-(triphenylphosphine)-palladium(II) chloride in 100 mL of dry THF at refluxing was added a solution of 3,5-(diphenyl)phenylmagnesium bromide, which was freshly prepared from 15.5 g (0.05 mol) of 3,5-(diphenyl)bromobenzene in 150 mL of dry THF and 1.5 g magnesium in 30 mL of dry THF with 1,2-dibromoethane as an initiator. After addition, the reaction mixture was maintained at reflux for three hours. Then it was cooled and 30 mL of water was carefully added. After removal of the solvents by vacuum rotary evaporator, the residue was extracted by dichloromethane followed by washing with dilute hydrochloric acid and water. The dichlomethane solution was dried over sodium sulfate and passed it through silica gel column. The solvents were removed. The pure 9,10-di-(3',5'-diphenyl)phenyl anthracene (Compound 5) (9.5 g) was obtained by recrystallization from hexane. Yield 75.0%.

Example 3

Synthesis of 3,5-di-(m-tolyl)bromobenzene

To a solution of 1,3,5-tribromobenzene(47.3 g, 0.15 mol) in 150 mL of dry tetrahydrofuran (THF) was added 0.5 g of bis-(triphenylphosphine)-palladium(II) chloride under nitrogen. After the solution was degassed with dry nitrogen for 5 minutes, 155 mL of m-tolyl magnesium bromide (0.2 M in THF) was added through an addition funnel at 70° C. under nitrogen. The reaction mixture was stirred under reflux for another two hours after addition. After cooling the reaction mixture was quenched by slowly adding 50 mL of 0.5 N HCl with stirring. Then the solvents were removed via a rotary evaporator. The residue was dissolved in hexane and washed with 0.1 M HCl followed by water. After removing the solvent, the crude residue was purified by chromatography on silica gel using hexane as the eluent. After drying, 28.0 g of, 3,5-di-m-tolyl bromobenzene was collected. Yield 55.3%.

Example 4

Synthesis of 9,10-di-(3',5'-m-tolyl)phenyl anthracene (Compound 11)

To a suspension of 6.5 g (0.02 mol) of 9.10-dibromoanthracene and 0.5 g of bis-(triphenylphosphine)-palladium(II) chloride in 100 mL of dry THF at refluxing was added to a solution of 3,5-di(m-tolyl)phenylmagnesium bromide, which was freshely prepared from 15.5 g (0.046 mol) of 3,5-di-(m-tolyl)bromobenzene in 150 mL of dry THF and clean, dry 1.5 g magnesium in 30 mL of dry THF with 1,2-dibromoethane as an initiator. After the addition, the reaction mixture was kept at reflux for another three hours. Then the reaction mixture was cooled and 30 mL of water was carefully added. After removal of the solvents by a rotary evaporator, the residue was extracted by dichloromethane followed by washing with dilute hydrochloric acid and water. The dichlomethane solution was dried over sodium sulfate and passed through a silica gel column. The pure 9,10-di-(3',5'-m-tolyl)-phenyl anthracene (compound 11) (11.5 g) was obtained by recrystallization from 300 mL of hexane. Yield 76.8%.

Example 5

Synthesis of 3,5-(1-naphthyl)bromobenzene

To a solution of 1,3,5-tribromobenzene (105.0 g, 0.22 mol) in 500 mL of dry tetrahydrofuran (THF) was added 1.0 g of bis-(triphenylphosphine)-palladium(II) chloride under nitrogen. After the solution was bubbled with dry nitrogen for 5 minutes, 1-naphthylmagnesium bromide, which was prepared from 150.0 g (0.48 mol) of 1-bromonaphthalene in 100.0 mL of dry THF and clean, dry 18.0 g of magnesium in 250 mL of dry THF with 1,2-dibromoethane as an initiator, was added through an addition funnel at 70° C. under nitrogen. The reaction mixture was stirred under reflux for another two hours. After the reaction mixture was cooled, it was quenched by slowly adding 25.0 mL of 5% HCl with stirring. Then the solvents were removed via a rotary evaporator. The residue was dissolved in dichloromethane and washed with 0.1 M HCl followed by water. After removal of solvents, the crude residue was purified by crystallizing from heptane. A 57.0 g of pure 3,5-di(1-naphthyl) bromobenzene was collected. Yield 63.5%.

Example 6

Synthesis of 9,10-di-[(3,5-(1-naphthyl)-phenyl]-anthracene (Compound 12)

To a suspension of 6.7 g (0.02 mol) of 9,10-dibromoanthracene and 0.3 g of bis-(triphenylphosphine)-palladium(II) chloride in 150 mL of dry THF heated at refluxing was added to a solution of 3,5-di-(1-naphthyl) phenylmagnesium bromide, which was freshly prepared from 18.4 g of (0.045 mol) of 3,5-di-(1-naphthyl)-bromobenzene in 150 mL of dry THF and clean, dry 1.5 g of magnesium in 30 mL of dry THF with 1,2-dibromoethane as an initiator. After the addition, the reaction mixture was kept at reflux for another three hours. Then the reaction mixture was cooled and 30 mL of 0.5% HCl was carefully added. After removal of the solvents by vacuum rotary evaporator, the residue was filtered and washed by water, 1:1 water:acetone, and followed by a minimum amount of dichlomethane. After drying, the pure 9,10-bis-[3',5'-(1-naphthyl)phenyl]anthracene (Compound12) (12.5 g) was obtained. Yield 74.0%.

Example 7

Synthesis of 2-naphthylene boronic acid

A solution of n-BuLi (1.6 M in hexane, 100 mL, 0.16 mol) was added via an addition funnel to 2-bromonaphthalene (30.0 g, 0.14 mol) in 200 mL of dry THF at −78° C. The yellow suspension was stirred at this temperature for a half hour, a solution of $B(OMe)_3$ (26.6 mL, 29.1 g, 0.28 mol) in 150 mL of dry THF was added dropwise, with the temperature kept below −60° C. The resulting colorless solution was allowed to warm to room temperature overnight, then 300 mL of 10 M HCl was added and the mixture stirred for a further one hour under nitrogen. Water and ether were added, and the aqueous layer was extracted several times with ether. The combined organic extracts were dried over $MgSO4$ and evaporated under reduced pressure to yield a white solid (21.0 g, 95%), which was used in the coupling reaction without further purification.

Example 8

Synthesis of 9,10-di-(2-naphthyl)anthracene (Compound 17)

Pd(PPh$_3$)$_4$ (1.0 g, 0.8 mmol) and 300 mL of 2.0 M aqueous Na$_2$CO$_3$ were added to a solution of 9.10-dibromoanthracene (34.0 g, 0.1 mol) and 2-naphthylene boronic acid (40.0 g, 0.232 mol) in 600 mL of toluene and 100 mL of ethanol. The reaction mixture was purged with nitrogen for 10 min. After refluxing under nitrogen overnight, the organic suspension layer was separated while hot and was added 300 mL of 2.0 N HCl and refluxed for one hour with vigorous stirring. The aqueous layer was separated again while hot followed by washing with water three times until pH is about 7. The precipitates from the organic layer was filtered and washed with small amount of cold acetone followed by toluene. After drying, 34.0 g of pure 9,10-di-(2-naphthyl)anthracene (compound 17) was obtained. Yield 80.0%.

Example 9

Synthesis of 9,10-di-[2-(6-methoxynaphthyl)]anthracene (compound 45)

To a suspension of 22.0 g (0.09 mol) of 9,10-dibromoanthracene and 0.75 g of bis(triphenylphosphine)palladium(II) chloride in 200 mL of dry THF at reflux was added a solution of 6-methoxy 2-naphthylmagnesium bromide, which was fresh by prepared from 50.0 g (0.211 mol) of 6-methoxy 2-bromonaphthylene in 400 mL of dry THF and 5.6 g of magnesium in 100 mL of dry THF with 1,2-dibromoethane as an initiator. After addition, the reaction mixture was maintained at reflux for three hours. Then it was cooled and 100 mL of THF and 50 mL of 15% hydrochloric acid was carefully added. After removal of the solvents by vacuum rotary evaporator, the residue was filtered and washed with water until pH=7. The crude product was refluxed in 500 mL of dichloromethane for one hour. After cooling, it was filtered and washed with a small amount of cold acetone to give 34.0 g of pure 9,10-di-[2-(6-methoxynaphthyl)]anthracene (Compound 45). Yield 77.1%.

EL Device Fabrication and Performance

Examples 10 to 18

EL devices of this invention were constructed in the following manner. The organic EL medium has an anode, a hole transport layer, an emissive and electron transport layer, and a cathode. The substrate was glass.

a) The anode was a conductive indium-tin-oxide (ITO) coated on a glass substrate. It was about 1000 Angstroms thick. The ITO glass was cleaned using a commercial glass plate cleaner. Prior to the deposition of the organic layers, the ITO substrate was subjected to an oxygen plasma clean in a commercial etcher.

b) A hole transport layer about was deposited onto the ITO substrate by vacuum vapor deposition using a tantalum boat source. The layer thickness was about 600 Angstroms.

c) An electron-transport and emissive layer was deposited on top of the hole transporting layer by vacuum vapor deposition using a tantalum boat source. The layer thickness was about 700 Angstroms.

d) A cathode layer was deposited on top of the electron transport and emissive layer. The layer thickness was about 2000 Angstroms and the atomic composition of the cathode was about 10 parts magnesium and 1 part silver.

The above deposition sequence was completed in a single sequence without a vacuum break between the deposition of individual layers. The completed EL device was then sealed with a cover glass plate in a dry glove box for protection against ambient environment. A desiccant material was also include in the sealed package to improve the storage life of the EL device.

The results of the EL devices from examples 10 to 18 are shown in Table I. Example 10 is a comparative example. Compound 3 used in this example is an arylamine. The light output and luminous efficiency obtained this EL device were substantially lower in comparison with the EL devices of Examples 11–18, which used aromatic hydrocarbons as the hole transport layer. An efficiency gain on the order of 30 to 40% has been realized by using an aromatic hydrocarbon as the hole transport layer.

TABLE I

| | Hole transport layer | Electron transport and emissive layer | Applied Voltage (V) | Brightness (cd/m2) | Efficiency (cd/A) | Color |
|---|---|---|---|---|---|---|
| Example 10 | Compound 3 | Alq | 7.5 | 578 | 2.9 | Green |
| Example 11 | Compound 61 | Alq | 16.1 | 433 | 2.17 | Green |
| Example 12 | Compound 17 | Alq | 6.3 | 855 | 4.2 | Green |
| Example 13 | Compound 11 | Alq | 8.9 | 929 | 4.65 | Green |
| Example 14 | Compound 12 | Alq | 10.7 | 877 | 4.22 | Green |
| Example 15 | Compound 36 | Alq | 8.6 | 820 | 4.10 | Green |
| Example 16 | Compound 53 | Alq | 9.0 | 726 | 3.63 | Green |
| Example 17 | Compound 54 | Alq | 7.8 | 836 | 4.18 | Green |
| Example 18 | Compound 45 | Alq | 8.5 | 879 | 4.39 | Green |

Examples 19 to 25

EL devices of this invention were constructed in a manner similar to Example 10–18. The organic EL medium has an anode, a hole transport layer, an emissive layer, an electron-transport layer, and a cathode. The substrate was glass.

a) The anode was a conductive indium-tin-oxide (ITO) coated on a glass substrate. It was about 1000 Angstrom thick. The ITO glass was cleaned using a commercial glass plate cleaner. Prior to the deposition of the organic layers, the ITO substrate was subjected to an oxygen plasma clean in a commercial etcher.

b) A hole transport layer about was deposited onto the ITO substrate by vacuum vapor deposition using a tantalum boat source. The layer thickness was about 600 Angstroms.

c) An emissive layer was deposited on top of the hole transport layer by vacuum vapor deposition using a tantalum boat source. The layer thickness was about 350 Angstroms.

d) An electron transport layer was deposited on top of the emissive layer by vacuum vapor deposition using a tantalum boat source. The layer thickness was about 350 Angstroms.

e) A cathode layer was deposited on top of the electron transport layer. The layer thickness was about 2000 Angstroms and the atomic composition of the cathode was about 10 parts magnesium and 1 part silver.

The above deposition sequence was completed in a single sequence without a vacuum break between the deposition of individual layers. The completed EL device was then sealed with a cover glass plate in a dry glove box for protection against ambient environment. A desiccant material was also include in the sealed package to improve the storage life of the EL device.

The results of the EL devices from examples 19 to 25 are shown in Table II. Example 19 is a comparative example using an arylamine (Compound 3) as the hole transport layer. The light output and luminous efficiency obtained from this EL were substantially lower in comparison with the EL device of Examples 20, which used an aromatic hydrocarbon Compound 17 as the hole transport layer instead of an arylamine. Otherwise, both EL devices have an identical structure. An efficiency gain of 34% has been realized in using the aromatic hydrocarbon as the hole transport layer. Example 24 is another comparative example using an arylamine (Compound 3) as the hole transport layer. The red light output and luminous efficiency obtained from this EL were substantially lower in comparison with the EL device of Examples 25, which used an aromatic hydrocarbon of Compound 17 as the hole transport layer instead of an arylamine. Otherwise, both EL devices have an identical structure. An efficiency gain of 80% has been realized in using the aromatic hydrocarbon as the hole transport layer.

PARTS LIST 10 substrate
20 anode
30 hole transport layer
40 electron transport layer
50 organic EL medium
60 cathode
100 substrate
200 anode
300 hole transport layer
400 emissive layer
500 electron transport layer
600 EL medium
700 cathode

What is claimed is:

1. An organic electroluminescent device, comprising:

an anode and cathode and therebetween a hole transport layer provided over the anode; and an electron transport layer having at least two portions provided over the hole transport layer and the cathode provided over the electron transport layer, the first portion including a fluorescent dye and the second portion providing an electron transport function, wherein;

the hole transport layer includes at least one non-amino aromatic hydrocarbon without a heteroatom in an aromatic ring and containing at least 20 carbon atoms and having an ionization potential greater than 5.0 eV.

2. The organic electroluminescent device of claim 1 wherein the fluorescent dye is selected to emit light in the red, green or blue portions of the spectrum.

3. The organic electroluminescent device of claim 1 wherein the fluorescent dye is a mixture of dyes selected to emit light in different portions of the spectrum.

4. An organic electroluminescent device, comprising, in order, the following layers:

an anode;

a hole transport layer that includes at least one non-amino aromatic hydrocarbon without a heteroatom in an aromatic ring and containing at least 20 carbon atoms and having an ionization potential greater than 5.0 eV;

am emissive layer that includes a fluorescent dye, from which electroluminescence originates;

an electron transport layer; and a cathode.

TABLE II

| Examples | Hole transport layer | Doped emissive layer | Electron transport layer | Applied Voltage (V) | Brightness (cd/m2) @ 20 mA/cm 2 | Efficiency cd/A | Emitting Light |
|---|---|---|---|---|---|---|---|
| Example 19 | Compound 3 | Alq + 1% FD 9 | Alq | 6.9 | 2219 | 11.1 | Green |
| Example 20 | Compound 17 | Alq + 1% FD 9 | Alq | 6.5 | 2994 | 14.9 | Green |
| Example 21 | Compound 12 | Alq + 1% FD 9 | Alq | 8.3 | 3133 | 15.6 | Green |
| Example 22 | Compound 45 | Alq + 1% FD 9 | Alq | 8.5 | 2848 | 14.24 | Green |
| Example 23 | *Compound 46 | Alq + 1% FD 9 | Alq | 7.4 | 1242 | 6.21 | Green |
| Example 24 | Compound 3 | Alq + 1% FD 13 | Alq | 7.9 | 439 | 2.20 | Red |
| Example 25 | Compound 17 | Alq + 1% FD 13 | Alq | 7.7 | 791 | 3.90 | Red |

*200 Angstroms.

The invention has been described in detail with particular reference to certain preferred embodiments thereof, but it will be understood that variations and modifications can be effected within the spirit and scope of the invention.

* * * * *